United States Patent
Ryabova et al.

(10) Patent No.: US 7,942,965 B2
(45) Date of Patent: May 17, 2011

(54) METHOD OF FABRICATING PLASMA REACTOR PARTS

(75) Inventors: Elmira Ryabova, Mountain View, CA (US); Jie Yuan, San Jose, CA (US); Jennifer Sun, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1093 days.

(21) Appl. No.: 11/688,011

(22) Filed: Mar. 19, 2007

(65) Prior Publication Data

US 2008/0233022 A1 Sep. 25, 2008

(51) Int. Cl.
*C30B 1/02* (2006.01)

(52) U.S. Cl. ......... 117/4; 117/5; 117/8; 117/9; 117/931; 438/786

(58) Field of Classification Search .............. 117/4, 5, 117/8, 9, 94, 931; 438/786
See application file for complete search history.

(56) References Cited

U.S. PATENT DOCUMENTS

| | | | |
|---|---|---|---|
| 4,346,147 A | 8/1982 | Barlier et al. | |
| 5,188,676 A | 2/1993 | Taylor | |
| 5,578,145 A | 11/1996 | Adamson et al. | |
| 5,914,064 A | 6/1999 | Gillespie et al. | |
| 6,087,640 A | 7/2000 | Gillespie et al. | |
| 6,380,056 B1 * | 4/2002 | Shue et al. | 438/591 |
| 6,455,395 B1 | 9/2002 | Boyle et al. | |
| 6,617,225 B2 | 9/2003 | Boyle et al. | |
| 6,846,726 B2 | 1/2005 | Ren et al. | |
| 6,853,141 B2 | 2/2005 | Hoffman et al. | |
| 7,108,746 B2 | 9/2006 | Zehavi et al. | |
| 7,137,546 B2 | 11/2006 | Zehavi et al. | |
| 7,429,540 B2 * | 9/2008 | Olsen | 438/786 |
| 2006/0243358 A1 | 11/2006 | Colburn et al. | |

* cited by examiner

*Primary Examiner* — Robert M Kunemund

(74) *Attorney, Agent, or Firm* — Patterson & Sheridan, LLP

(57) ABSTRACT

A method of fabricating silicon parts are provided herein. The method includes growing a silicon sample, machining the sample to form a part, and annealing the part by exposing the part sequentially to one or more gases. Process conditions during silicon growth and post-machining anneal are designed to provide silicon parts that are particularly suited for use in corrosive environments.

16 Claims, 5 Drawing Sheets

METHOD OF FABRICATING PLASMA REACTOR PARTS

BACKGROUND

1. Field

Embodiments of the present invention generally relate to a method for fabricating parts and, more specifically, to a method for fabricating parts with improved chemical resistance.

2. Description of the Related Art

The fabrication of microelectronics or integrated circuit devices typically involves a complicated process sequence requiring hundreds of individual steps performed on semiconductors, dielectric and conductive substrates. Examples of these process steps include oxidation, diffusion, ion implantation, thin film deposition, cleaning, etching and lithography. Plasma processes are often used for thin film deposition and etching, which are performed in a plasma chamber. In chemical vapor deposition, reactive species are generated by applying voltages to suitable process gases, and subsequent chemical reactions result in the formation of a thin film on a substrate. In plasma etching, a previously deposited film is exposed to the reactive species in a plasma, often through a patterned mask layer formed in a prior lithography step. Reactions between the reactive species and the deposited film result in the removal, or etching, of the deposited film.

When chamber parts are exposed to the plasma environment for extended periods, deterioration may occur due to reaction with the plasma species. Thus, there is an ongoing need for alternative materials or methods to fabricate parts with reduced corrosion rates and increased lifetime.

SUMMARY

An improved process of growing a silicon sample, an improved process of annealing a silicon part, and a method of fabricating a silicon part that includes at least one of the improved growth process or the improved annealing process are respectively provided. Silicon parts fabricated from embodiments of this invention exhibit enhanced corrosion resistance, and are particularly suitable for use in plasma or other reactive environments.

One embodiment of the invention provides a method of fabricating a silicon part, which includes: (a) providing silicon sample using a cyclic silicon growth process, (b) machining the silicon sample to form a part, and (c) annealing the part. The silicon growth process of this embodiment may further include: (a1) initiating silicon growth in a first inert gas atmosphere for a first time period, (a2) continuing silicon growth in a reducing gas atmosphere for a second time period, (a3) continuing silicon growth in a second inert gas atmosphere for a third time period, and (a4) performing (a2) and (a3) for a sufficient number of cycles until desired properties are obtained for the silicon sample.

Another embodiment provides a method of fabricating a silicon part, which includes: (a) growing a silicon sample, (b) machining the silicon sample to form a part, and (c) annealing the part by exposing the part to at least an inert gas for a first time period and a reducing gas for a second time period.

Another embodiment provides a method of annealing a silicon part, which includes: (a) providing a silicon part in an enclosure, (b) introducing nitrogen gas to the enclosure, (c) ramping up the temperature in the enclosure to an annealing temperature and annealing the part for a first time period, (d) replacing the nitrogen in the enclosure with an inert gas and annealing the part for a second time period, (e) replacing the inert gas in the enclosure with a reducing gas and annealing the part for a third time period; and (f) cooling the part in the reducing gas by ramping down the temperature.

Another embodiment provides a silicon part for use in a plasma chamber, wherein the part has an erosion rate of less than about 2.4 microns per hour when exposed to a fluorine-containing plasma.

Yet another embodiment of the invention provides a plasma process chamber that includes a chamber body, a support pedestal disposed in the chamber body and adapted to receive a substrate thereon, a silicon collar disposed around the support pedestal and configured to surround the substrate, and a power source for forming plasma within the chamber. The silicon collar is fabricated using a method that includes: (a) providing a machined silicon collar, and (b) annealing the machined collar by exposing the part sequentially to nitrogen gas for a first time period, an inert gas for a second time period, and a reducing gas for a third time period.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention provide a method for fabricating parts made of silicon with improved characteristics such as reduced stress and enhanced chemical resistance. As used herein, silicon includes both single crystal silicon and polysilicon. The improved silicon parts may be fabricated by using a method that includes at least one of an improved silicon growth process of this invention or an improved post-machining anneal process of this invention.

These improved processes can also be used alone, or in conjunction with each other, to achieve improved properties of the silicon crystals or fabricated parts.

Figure 1:
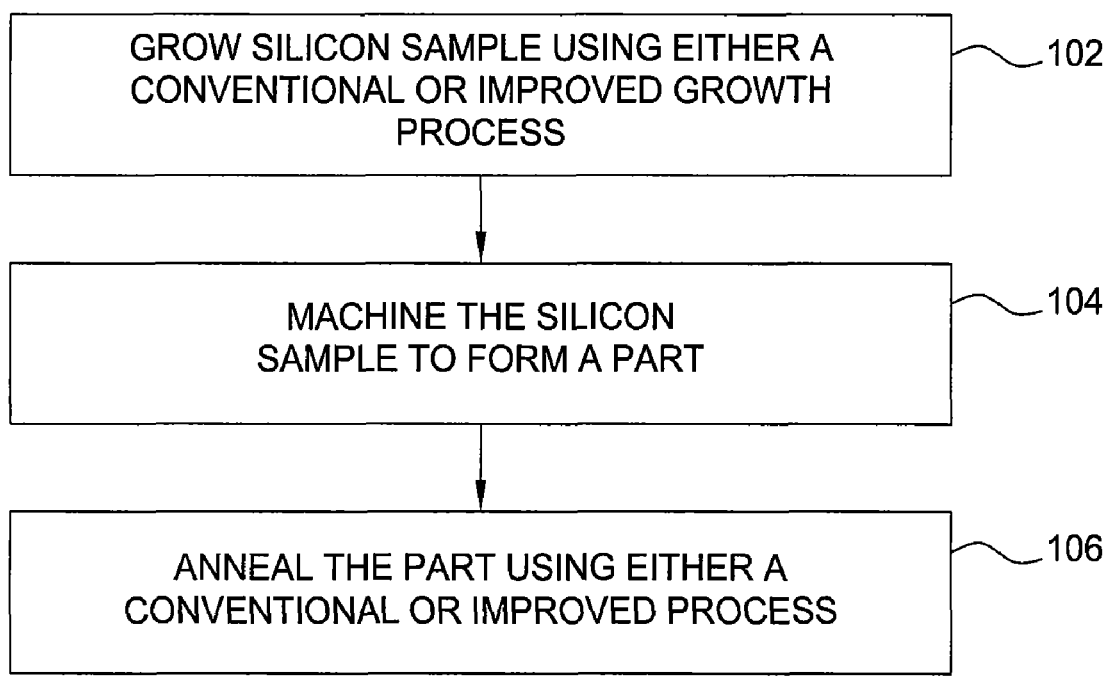
FIG. 1 illustrates one embodiment of a method for fabricating silicon parts.

FIG. 1 illustrates one embodiment of an exemplary method 100 for fabricating these improved silicon parts. The method 100 begins at box 102, where silicon is grown, for example, in a furnace. The silicon growing process may be a conventional process or an improved growth process in accordance to embodiments of this invention. A silicon sample from this growth process is then machined to form a part, as shown in box 104. In box 106, the silicon part is annealed using either a conventional process, or an improved anneal process in accordance with embodiments of this invention, with the selection of the process being dependent on the selection made at box 102. For example, if a conventional growth process is used, then the improved anneal process will be used. However, if the improved growth process is used, then either the conventional or improved anneal process may be used.

One conventional silicon growth process is the Czochralski process, details of which can be found, for example, in "Czochralski growth of Si-single crystals", by Abrosimov et al., Journal of Crystal Growth, Volume 174, Number 1, April 1997, pp. 182-186 (5), which is herein incorporated by reference in its entirety. It is contemplated that other suitable processes may be utilized to grow silicon.

Figure 2:
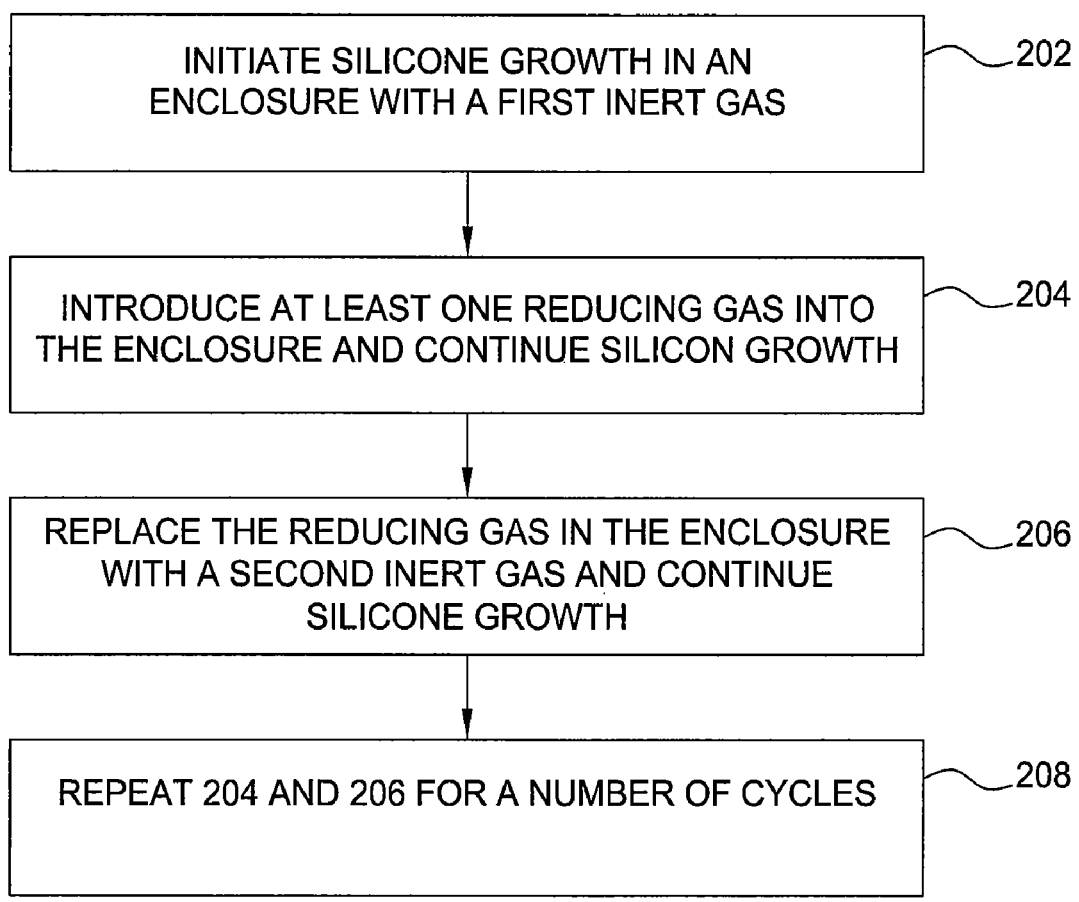
FIG. 2 illustrates one embodiment of a process of growing silicon.

One embodiment of a modified growth process 200 is illustrated in FIG. 2. The process 100 begins at box 202, where silicon growth starts with conditions such as those in a conventional process with a silicon seed crystal inside a closed furnace or enclosure under a static, inert gas atmosphere. For example, argon (Ar) may be used at a first pressure, P1, between about 30 mbar to about 50 mbar, with the furnace at a temperature between about 1500 to about 1900 degrees Celsius (° C.). The silicon growth continues under these conditions for a first time period, for example, from about 2 hrs. to about 12 hrs.

A second gas is introduced into the furnace at box 204. The second gas is a reducing gas, which may be selected from hydrogen ($H_2$), nitrogen ($N_2$) and hydrogen mixture ($N_2/H_2$), hydrofluorocarbons ($C_xH_yF_z$), fluoroalkanes ($C_xF_z$), where x, y and z are integers at least equal to 1, carbon monoxide (CO), carbon dioxide ($CO_2$), ammonia ($NH_3$), $H_2/CO_2$ mixture, $CO/CO_2$ mixture, and $H_2/CO/CO_2$ mixture. The $N_2/H_2$ mixture also includes compositions commonly known as forming gas, with $H_2$ concentration of up to about 10 percent by volume. In one embodiment, the second gas is a forming gas having a $H_2$ concentration of about 6 percent by volume. The inert gas from box 202 is purged from the furnace by the addition of the second gas in box 204.

A third gas, usually an inert gas, may also be introduced into the furnace along with the reducing gas at box 204. In one embodiment, the second and third gases are pre-mixed prior to being introduced into the furnace. The third gas may include nitrogen ($N_2$), argon (Ar), helium (He), neon (Ne), krypton (Kr) and xenon (Xe).

The pressure P2 during the process described in 204 is kept within a range of about 30 mbar to about 60 mbar, and silicon growth continues for a second time period ranging from about 2 hours to about 12 hours. In one embodiment, the pressure is about 40 mbar to about 50 mbar. The ratio of the reducing gas to inert gas during this growth is in a range of about 2% to about 20% by volume. The inert and reducing gas environment helps remove oxygen from the silicon sample, and results in improved properties for the sample.

The gases in the furnace are purged and replaced with a second inert gas at box 204, which may or may not be the same as described with reference to box 202. Inert gas such as Ar, He, Ne, Kr and Xe are suitable for use as the second inert gas. In one embodiment, the second inert gas is the same as described with reference to box 202, and the conventional pressure conditions, namely, about 30 mbar to about 50 mbar, is used. Silicon growth continues under this condition for a third time period ranging from about 2 hrs. to about 12 hrs.

The silicon sample is then cycled through the process as described with reference to boxes 202 and 204 several times until the desired material properties and microstructure are obtained at box 206. Improved characteristics such as reduced oxygen clusters, reduced dislocation density (e.g., less than about $10^{16}$ per $cm^2$), or improved grain size uniformity (e.g., less than about 3% size distribution), are beneficial for forming parts with enhanced corrosion resistance. In one embodiment, about 3-5 cycles may be used, although other numbers of cycles may also used, depending on the specific sample requirements.

Figure 3:
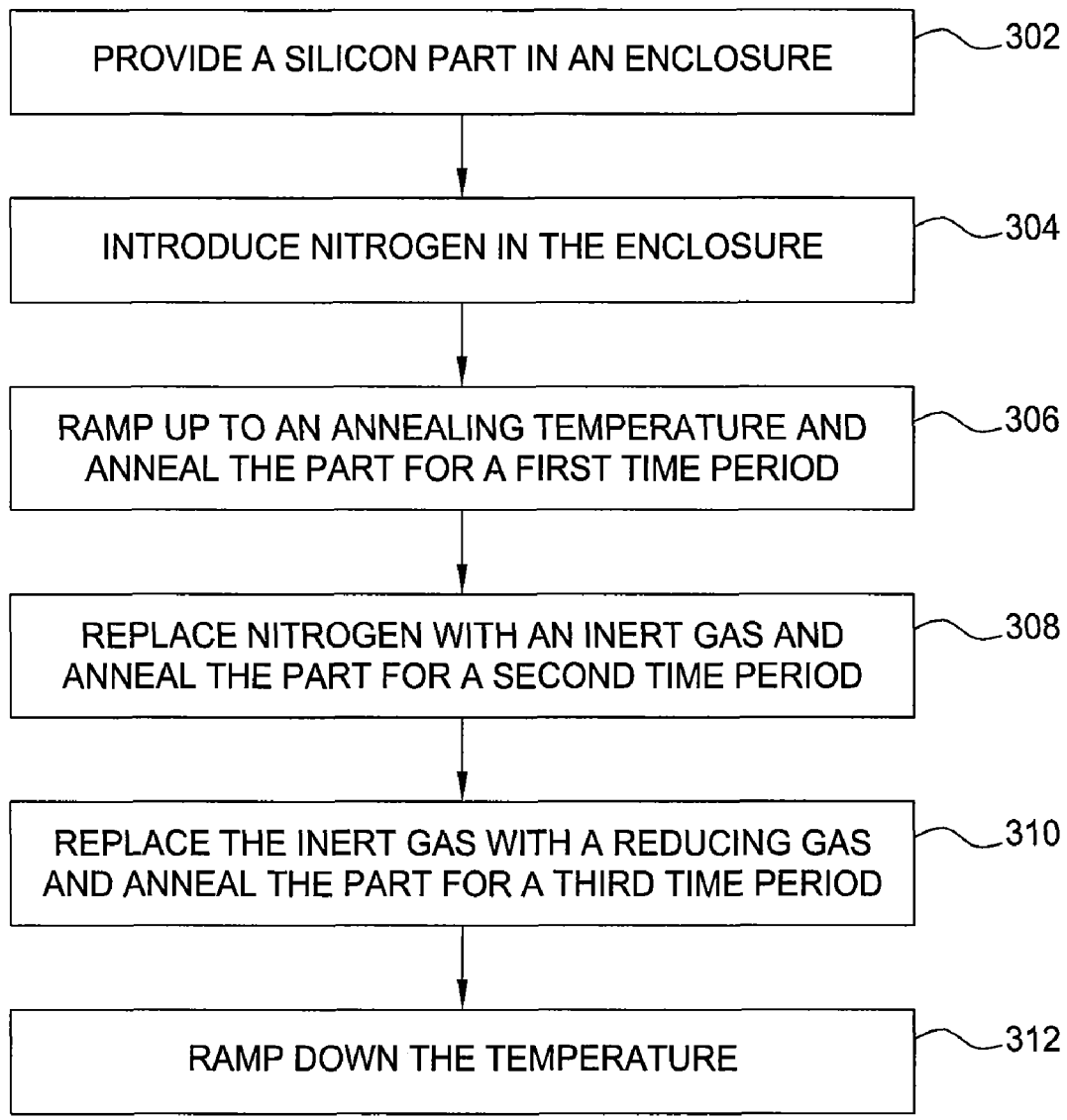
FIG. 3 illustrates one embodiment of a process of annealing a silicon part.

A silicon sample produced using the growth process 200 may then be machined to form a silicon part. After machining, the part may be treated or annealed, one embodiment of such an annealing process 300 is illustrated in FIG. 3.

The annealing process 300 starts by disposing a silicon part in a furnace or enclosure at box 302. A first gas, e.g., nitrogen ($N_2$), is introduced into the enclosure up to a first pressure in a range of about 100 mbar to about 1000 mbar at box 304.

The temperature of the enclosure is ramped up at box 306 from a first temperature, e.g., ambient temperature, to a second temperature, also referred to as the annealing temperature. The annealing temperature may be in a range of about 100 to about 500 degrees Celsius (° C.). The heating rate is selected to be sufficiently slow in order to minimize thermal stress in the part, yet fast enough to provide for reasonable throughput. For example, a heating rate in a range of about 20 to about 50 degrees Celsius per minute (° C./min.) is suitable for many applications. The part is maintained at the annealing temperature for a first time period, which may range from about 1 hour to about 5 hours.

An inert gas is introduced, and $N_2$ is substantially purged from the enclosure at box 308. The sample is exposed to the inert gas at the same pressure as in described with reference to box 304 and annealed for a second time period, which may range from about 2 to about 72 hours. In one embodiment, the inert gas is Ar. Other inert gases such as He, Ne, Kr and Xe may also be used.

A reducing gas is introduced, and the inert gas from box 308 is substantially purged from the enclosure at box 310. The silicon part is exposed to the reducing gas at the same pressure and temperature as used in the process described with reference to box 308 for a third time period, which may range from about 2 to about 72 hours. In one embodiment, the reducing gas is a mixture of $N_2$ and $H_2$, for example, a forming gas with a concentration of $H_2$ of less than about 10 percent by volume, preferably about 6 percent by volume. Other reducing gases may also be used, for example, $H_2$, $N_2/H_2$ mixture, $C_xH_yF_z$, $C_xF_z$ (where x, y and z are integers at least equal to 1), CO, $CO_2$, $NH_3$, $H_2/CO_2$ mixture, $CO/CO_2$ mixture, and $H_2/CO/CO_2$ mixture.

The temperature is ramped down at box 312 over a time period from about 2 to about 50 hours to allow gradual cooling of the annealed part to a third temperature, such as ambient temperature. During this cool down period, the reducing gas atmosphere is maintained at the same pressure as described in with reference to box 310 under isobaric condition. Similar to the heating process described with reference to box 306, the part is cooled at a controlled rate to minimize thermal stress that might otherwise arise from an excessively fast cooling. For example, a cooling rate from about 20° C./min. to about 5° C./min. may be used.

The ramp-up heating and ramp-down cooling rates during the processes described with reference to boxes 306 and 312 are controlled to be sufficiently slow in order to minimize stress that might arise from non-uniform thermal expansion or contraction, while high enough to provide a practical throughput for the process. The specific ramp-up and ramp-down time also depend on the specific parts. For example, the size, shape, surface area to volume ratio, and thermal properties of the parts such as coefficient of thermal expansion or thermal capacity, are factors to consider in determining the appropriate heating or cooling rates.

In other embodiments of the anneal process, the first gas in utilized in the process described with reference to box 304 may be an inert gas such as Ar, among others (but not $N_2$). In that case, process described with reference to box 308 shown in FIG. 3 may be omitted. That is, after annealing the part in an inert gas (instead of $N_2$) in boxes 304 and 306, the process proceeds to box 310, in which the inert gas is replaced with a reducing gas for further annealing.

After annealing, the part may undergo further processing, as needed, to prepare it for use or installation.

Comparative erosion tests have been conducted for several silicon parts that were fabricated using embodiments of the present invention. The parts under test were made from silicon samples that were grown under different conditions according to various embodiments of the present invention, and annealed according to one embodiment of the invention. Erosion (or corrosion) rates were obtained by performing thickness measurements on the parts before and after exposure to a reactive atmosphere, e.g., a fluorine-based plasma.

Results show that silicon parts fabricated using embodiments of the invention exhibit improved erosion resistance, or reduced erosion rates, ranging from about 4 percent to about 24 percent, compared to a silicon part that is fabricated according to conventional growth and anneal processes. Erosion rates (for exposure to a fluorine-containing plasma) of less than about 2.4 microns per hour ($\mu$m/hr.) are obtained for many samples, and as low as about 2.2 $\mu$m/hr., compared to about 2.8 $\mu$m/hr. for a conventional sample.

Embodiments of this invention can be used to fabricate silicon parts for a variety of applications. These improved parts are also suitable for use in corrosive environments such as those encountered in plasma processes. A variety of plasma deposition and etch chambers may benefit from the teachings disclosed herein, and in particular, dielectric etch chambers such as the ENABLERS etch chamber, which may be part of a semiconductor wafer processing system such as the CENTURA® system, the PRODUCER® etch chamber, the eMax® etch chamber, among others, all of which are available from Applied Materials, Inc. of Santa Clara, Calif. Details of the ENABLER® chamber have been disclosed in U.S. Pat. No. 6,853,141, "Capacitively Coupled Plasma Reactor with Magnetic Plasma Control," which is herein incorporated by reference in its entirety. It is contemplated that other plasma reactors, including those from other manufacturers, may be adapted to benefit from the invention.

Figure 4:
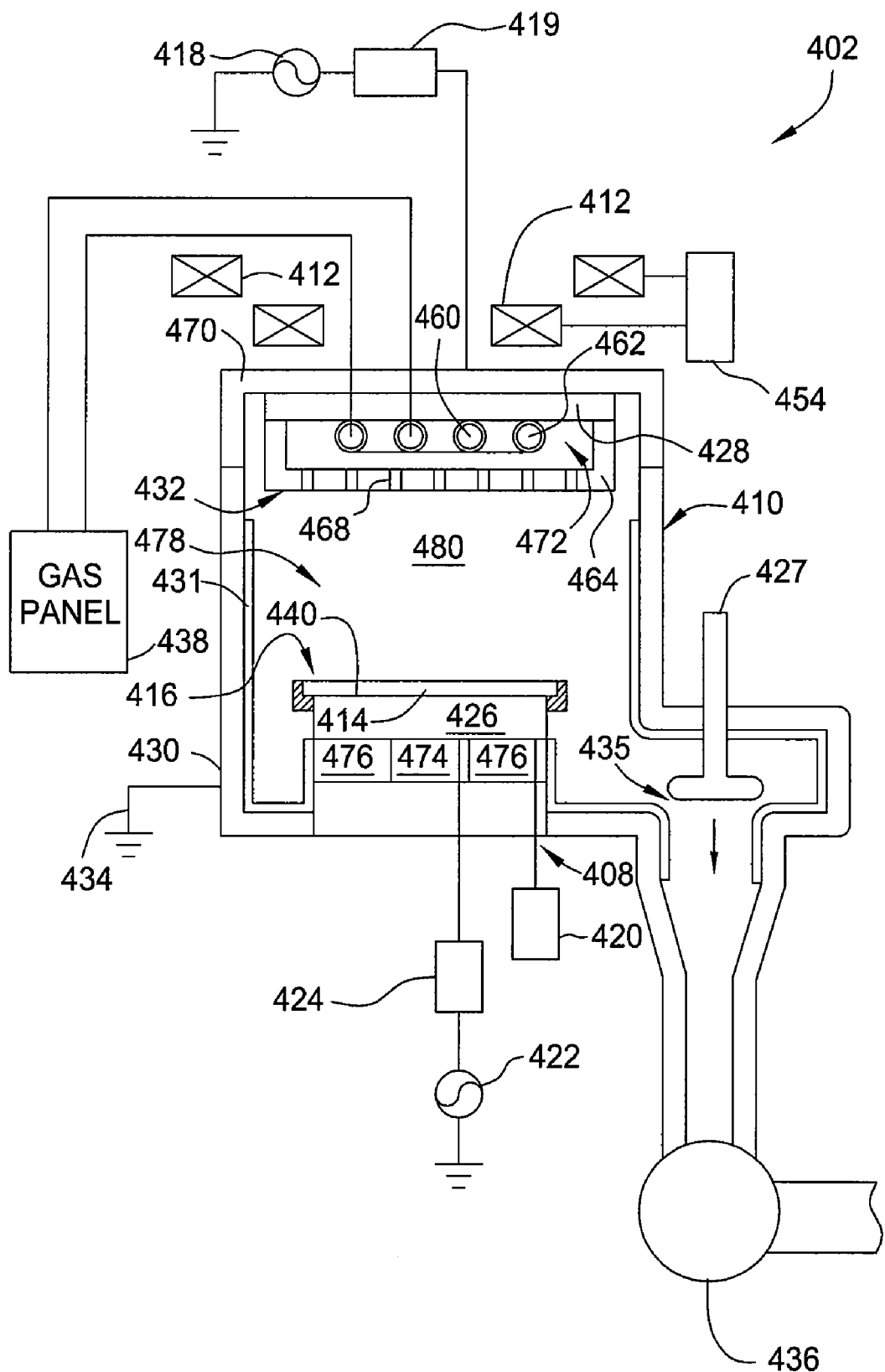
FIG. 4 is a schematic diagram of one embodiment of an exemplary plasma etch chamber that can benefit from embodiments of this invention.

FIG. 4 depicts a schematic, cross-sectional diagram of one embodiment of an exemplary plasma processing chamber 402 that can benefit from embodiments of this invention. The embodiment of the reactor shown herein is provided for illustrative purposes and should not be used to limit the scope of the invention.

In this embodiment, chamber 402 is used for plasma processing, e.g., etching, of a substrate 414. Process uniformity can be tuned by using a gas diffuser 432, which is designed to enable compensation for conductance or other chamber attributes that cause asymmetrical processing, i.e., processing results that are not symmetrically relative to a centerline of the substrate.

In one embodiment, chamber 402 comprises a vacuum chamber body 410 having a conductive chamber wall 430 and bottom 408. The chamber wall 430 is connected to an electrical ground 434. A lid 470 is disposed on the chamber wall 430 to enclose an interior volume 478 defined within the chamber body 410. At least one solenoid segment 412 is positioned exterior to the chamber wall 430. The solenoid segment(s) 412 may be selectively energized by a DC power source 454 that is capable of producing at least 5V to provide a control knob for plasma processes formed within the processing chamber 402.

A ceramic liner 431 is disposed within the interior volume 478 to facilitate cleaning of the chamber 402. The byproducts and residue of the etch process may be readily removed from the liner 431 at selected intervals.

A substrate support pedestal 416 is disposed on the bottom 408 of the process chamber 402 below the gas diffuser 432. A process region 480 is defined within the interior volume 478 between the substrate support pedestal 416 and the diffuser 432. The substrate support pedestal 416 may include an electrostatic chuck 426 for retaining a substrate 414 on a surface 440 of the pedestal 416 beneath the gas diffuser 432 during processing. The electrostatic chuck 426 is controlled by a DC power supply 420.

In one embodiment, a collar 500 is disposed around an outer perimeter of the pedestal 416 as well as the substrate 414. In one embodiment, the collar 500 is a silicon part fabricated according to embodiments of this invention, and exhibits improved corrosion resistance compared to other parts fabricated using conventional processes, and as such, protects the pedestal 416 from damage during substrate processing. Additional details about the collar 500 will be discussed below in connection with FIGS. 5A-B.

The support pedestal 416 may be coupled to an RF bias source 422 through a matching network 424. The bias source 422 is generally capable of producing an RF signal having a tunable frequency of 50 kHz to 13.56 MHz and a power of between 0 and 5000 Watts. Optionally, the bias source 422 may be a DC or pulsed DC source.

The support pedestal 416 may also include inner and outer temperature regulating zones 474, 476. Each zone 474, 476 may include at least one temperature regulating device, such as a resistive heater or a conduit for circulating coolant, so that the radial temperature gradient of the substrate disposed on the pedestal may be controlled.

The interior of the chamber 402 is a high vacuum vessel that is coupled to a vacuum pump 436 through an exhaust port 435 formed through the chamber wall 430 and/or chamber bottom 408. A throttle valve 427 disposed in the exhaust port 435 is used in conjunction with the vacuum pump 436 to control the pressure inside the processing chamber 402. The position of the exhaust port 435 and other flow restrictions within the interior volume 478 of the chamber body 410 greatly influence the conductance and gas flow distribution within the processing chamber 402.

The gas diffuser 432 provides a conduit through which at least one process gas is introduced into the processing region 480. In one embodiment, the gas diffuser 432 may provide process gases to the region 480 in an asymmetrical manner that may be used to tune the conductance and gas flow distribution described above that are caused by the other chamber components (i.e., location of the exhaust port, geometry of the substrate support pedestal or other chamber component) so that the flow of gases and species are delivered to the substrate in a uniform, or selected, distribution. Moreover, the gas diffuser 432 may be utilized to position the plasma relative to the centerline of the substrate 414 (which is concentrically disposed on the pedestal 416). As a result, the configuration of the gas diffuser 432 may be selected to improve process uniformity, or alternatively, create a predefined offset in processing results. For example, the configuration of the gas diffuser 432 may be selected to direct the flow of gas entering the process region 480 above the substrate support pedestal 416 in a manner that compensates for the chamber conductance. This may be accomplished by configuring the gas diffuser 432 to deliver gas into the process chamber with an asymmetry that offsets the asymmetric effects of the chamber conductance on plasma location and/or the delivery of ions and/or reactive species to the surface of the substrate during processing.

In one embodiment illustratively depicted in FIG. 4, the gas diffuser 432 includes at least two gas distributors 460, 462, a mounting plate 428 and a gas distribution plate 464. The gas distributors 460, 462 are coupled to one or more gas panels 438 through the lid 470 of the processing chamber 402, and are also coupled to at least one of the mounting or gas distribution plates 428, 464. The flow of gas through the gas distributors 460, 462 may be independently controlled. Although the gas distributors 460, 462 are shown coupled to a single gas panel 438, it is contemplated that the gas distributors 460, 462 may be coupled to one or more shared and/or separate gas sources. Gases provided from the gas panel 438 are delivered into a region 472 defined between the plates 428, 464, then exit through a plurality of apertures 468 formed through the gas distribution plate 164 into the processing region 480.

The mounting plate 428 is coupled to the lid 470 opposite the support pedestal 416. The mounting plate 428, which is fabricated from or covered by an RF conductive material, is coupled to an RF source 418 through an impedance transformer 419 (e.g., a quarter wavelength matching stub). The source 418 is generally capable of producing an RF signal having a tunable frequency of about 462 MHz and a power between about 0 and 2000 Watts. The mounting plate 428 and/or gas distribution plate 164 is powered by the RF source 418 to maintain a plasma formed from the process gases in the process region 480.

Figure 5B:
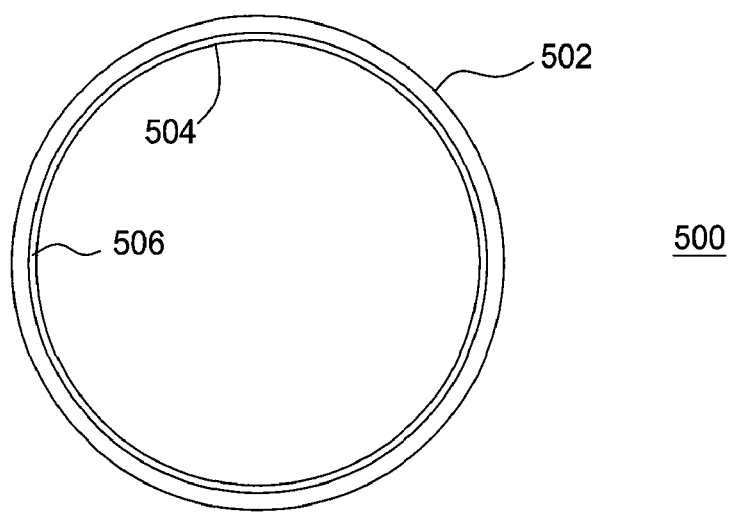
FIG. 5B is a plan view of one embodiment of a silicon collar.
Figure 5A:
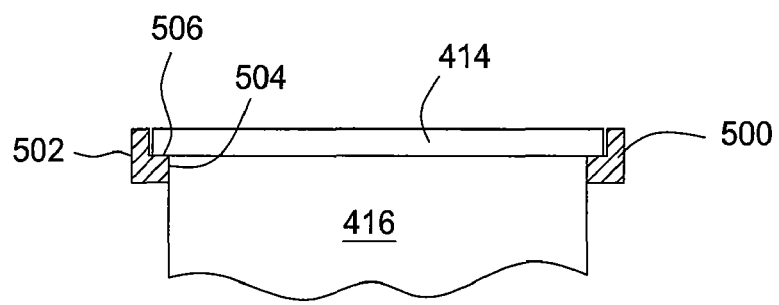
FIG. 5A is a schematic cross-sectional view of one embodiment of an exemplary silicon collar suitable for use in the chamber of FIG. 4.

FIGS. 5A-B are schematic illustrations of one embodiment of a silicon collar 500, which may be used in chamber 402 of FIG. 4. FIG. 5A shows an enlarged view of collar 500 disposed around pedestal 416 and substrate 414. In one embodiment, the collar 500 is polysilicon ring. The collar 500 can be attached to the pedestal 416 by a variety of methods known to one skilled in the art. By providing the silicon collar 500 in close proximity to, and surrounding the substrate 414, e.g., a silicon wafer, process uniformity such as center to edge uniformity can be improved. Such improvement is believed to result from the plasma or electrical environment near the substrate 414 being modified by the silicon collar 500.

FIG. 5B shows a plan view of the collar 500 depicted in FIG. 5A. The collar 500 has an outer perimeter 502 and an inner perimeter 504. In one embodiment, the collar 500 has an inner diameter of about 12 inches and an outer diameter of about 13 inches. As shown in the cross-sectional view of FIG. 5A, the collar 500 also has a recessed portion 506 adjacent the inner perimeter 504, which is sized accordingly to accommodate a substrate.

Figure 6:
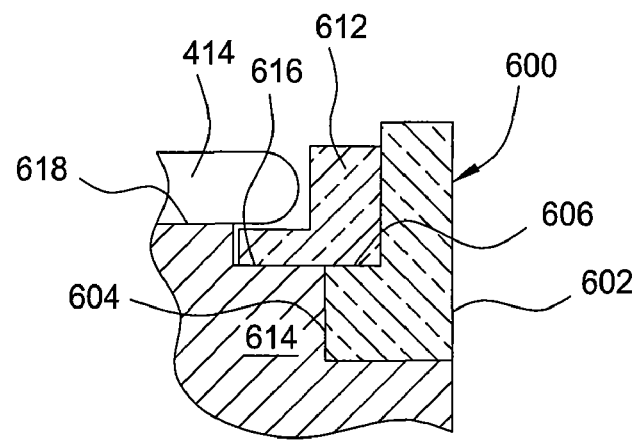
FIG. 6 is another embodiment of an exemplary silicon collar suitable for use in the chamber of FIG. 4.

FIG. 6 is a partial sectional view of another embodiment of an exemplary silicon collar 600 suitable for use in the chamber of FIG. 4. The collar 600 is generally fabricated from silicon according to embodiments of this invention as described above and includes an outer perimeter 602, an inner perimeter 604 and a recessed portion 606. The recessed portion 606 is generally configured to support a cover ring 612. The cover ring 612 is additionally supported on a ledge 616 of a pedestal 614 which extends outward below a substrate support surface 618 upon which the substrate 414 rests during processing. The cover ring 612 may be fabricated from silicon according to embodiments of this invention, or from an other suitable material, such as quartz. The support surface 618 is configured such that the outer edge of the substrate 414 overhangs an inner portion of the cover ring 612.

Silicon parts such as the collars 500, 600 fabricated according to embodiments of the invention are found to have improved characteristics such as morphology and microstructure, resulting in enhanced resistance to corrosion by plasma gases, reduced mechanical stress and reduced particle generation.

Although the examples and discussions above focus on fabricating silicon parts for plasma chambers, one or more embodiments of the invention can also be applied to other parts made of a variety of materials for different applications. For example, the anneal process of the present invention may also be applied to parts made of materials such as ceramics, metals, dielectrics, alloys, and so on. Depending on the specific applications, coated parts, including silicon-coated parts, may also benefit from the annealing process of this invention.

While the foregoing is directed to embodiments of the present invention, other and further embodiments of the invention may be devised without departing from the basic scope thereof, and the scope thereof is determined by the claims that follow.

What is claimed is:

1. A method of fabricating a silicon part, comprising:
   (a) growing a silicon sample using a cyclic silicon growth process, comprising:
      (a1) initiating silicon growth in a first inert gas atmosphere comprising a first inert gas for a first time period;
      (a2) continuing silicon growth in a reducing gas atmosphere comprising a reducing gas for a second time period;
      (a3) continuing silicon growth in a second inert gas atmosphere comprising a second inert gas for a third time period; and
      (a4) repeating (a2) and (a3) for a sufficient number of cycles until desired properties are obtained for the silicon sample;
   (b) machining the silicon sample to form a silicon part; and
   (c) annealing the silicon part.

2. The method of claim 1, wherein the reducing gas is selected from the group consisting of hydrogen ($H_2$), nitrogen and hydrogen mixture ($N_2/H_2$), hydrofluorocarbons, fluoroalkanes, carbon monoxide (CO), carbon dioxide ($CO_2$), ammonia ($NH_3$), $H_2/CO_2$ mixture, $CO/CO_2$ mixture, and $H_2/CO/CO_2$ mixture.

3. The method of claim 1, wherein the first inert gas is argon, and the reducing gas is selected from the group consisting of forming gas, $H_2$, and $H_2/CO_2$ mixture.

4. The method of claim 1, wherein the first and second inert gas atmospheres comprise the same gas, and both of the first and second inert gases are selected from the group consisting of argon, helium, neon, krypton, and xenon.

5. The method of claim 4, wherein each of the first and second inert gas atmospheres is independently at a pressure between about 30 millibar to about 50 millibar, and the reducing gas atmosphere is at a pressure between about 30 millibar to about 60 millibar.

6. The method of claim 1, wherein annealing the silicon part in (c) comprises:
   (c1) exposing the silicon part to an inert gas at a first pressure within an enclosure;
   (c2) heating the silicon part to an annealing temperature;
   (c3) maintaining the silicon part at the annealing temperature for a first time period;
   (c4) introducing a first reducing gas to substantially purge the inert gas from the enclosure, and annealing the silicon part in the first reducing gas at a second pressure for a second time period; and
   (c5) cooling down the silicon part with the first reducing gas at the second pressure.

7. A method of fabricating a silicon part, comprising:
   (a) growing a silicon sample;
   (b) machining the silicon sample to form a silicon part; and
   (c) annealing the silicon part by exposing the silicon part to at least an inert gas for a first time period and a reducing gas for a second time period.

8. The method of claim 7, wherein the inert gas is selected from the group consisting of argon, helium, neon, krypton, and xenon, and the reducing gas is selected from the group consisting of hydrogen ($H_2$), nitrogen and hydrogen mixture ($N_2/H_2$), hydrofluorocarbons, fluoroalkanes, carbon monoxide (CO), carbon dioxide ($CO_2$), ammonia ($NH_3$), $H_2/CO_2$ mixture, $CO/CO_2$ mixture, and $H_2/CO/CO_2$ mixture.

9. The method of claim 7, wherein the annealing (c) further comprises, prior to exposing the silicon part to the inert gas, annealing the silicon part in nitrogen ($N_2$).

10. The method of claim 9, wherein the reducing gas is a mixture of $N_2/H_2$ having a $H_2$ concentration of less than about 10 percent by volume.

11. A method of annealing a silicon part, comprising:
   (a) disposing a silicon part into an enclosure;
   (b) introducing nitrogen gas into the enclosure;
   (c) heating the silicon part to an annealing temperature and annealing the silicon part for a first time period;
   (d) replacing the nitrogen gas in the enclosure with an inert gas and annealing the silicon part for a second time period;
   (e) replacing the inert gas in the enclosure with a reducing gas and annealing the silicon part for a third time period; and
   (f) cooling the silicon part in the reducing gas to an ambient temperature.

12. The method of claim 11, wherein the reducing gas is selected from the group consisting of hydrogen ($H_2$), nitrogen and hydrogen mixture ($N_2/H_2$), hydrofluorocarbons, fluoroalkanes, carbon monoxide (CO), carbon dioxide ($CO_2$), ammonia ($NH_3$), $H_2/CO_2$ mixture, $CO/CO_2$ mixture, and $H_2/CO/CO_2$ mixture.

13. The method of claim 11, wherein the reducing gas is a mixture of $N_2/H_2$ having a $H_2$ concentration of less than about 10 percent by volume.

14. The method of claim 11, wherein the annealing temperature is within a range from about 100° C. to about 500° C.

15. The method of claim 11, wherein the silicon part is heated at a heating rate within a range from about 20° C. per minute to about 50° C. per minute.

16. The method of claim 11, wherein the silicon part is cooled at a cooling rate within a range from about 20° C. per minute to about 5° C. per minute.

\* \* \* \* \*

UNITED STATES PATENT AND TRADEMARK OFFICE
CERTIFICATE OF CORRECTION

| | |
|---|---|
| PATENT NO. | : 7,942,965 B2 |
| APPLICATION NO. | : 11/688011 |
| DATED | : May 17, 2011 |
| INVENTOR(S) | : Ryabova et al. |

It is certified that error appears in the above-identified patent and that said Letters Patent is hereby corrected as shown below:

IN THE SPECIFICATIONS:

In the Detailed Description:

Column 5, Line 2, please delete "5°C" and insert --50°C-- therefor;

Column 5, Line 48, please delete "ENABLERS" and insert --ENABLER®-- therefor.

Signed and Sealed this
Ninth Day of August, 2011

David J. Kappos
*Director of the United States Patent and Trademark Office*